(12) United States Patent
Yoon

(10) Patent No.: US 9,048,660 B2
(45) Date of Patent: Jun. 2, 2015

(54) SHORT-CIRCUIT DETECTING APPARATUS AND METHOD OF HEATING SYSTEM FOR HIGH VOLTAGE BATTERY

(71) Applicants: Hyundai Motor Company, Seoul (KR); Kia Motors Corporation, Seoul (KR)

(72) Inventor: Jong Hu Yoon, Jeollanam-do (KR)

(73) Assignees: Hyundai Motor Company, Seoul (JP); Kia Motors Corporation, Seoul (KR)

( * ) Notice: Subject to any disclaimer, the term of this patent is extended or adjusted under 35 U.S.C. 154(b) by 203 days.

(21) Appl. No.: 13/893,498

(22) Filed: May 14, 2013

(65) Prior Publication Data

US 2014/0153141 A1    Jun. 5, 2014

(30) Foreign Application Priority Data

Dec. 5, 2012 (KR) .......................... 10-2012-0139992

(51) Int. Cl.
*H01H 3/16* (2006.01)
*H02H 3/16* (2006.01)
*G01R 31/02* (2006.01)
*B60L 3/00* (2006.01)
*H02H 3/087* (2006.01)

(52) U.S. Cl.
CPC .................. *H02H 3/16* (2013.01); *G01R 31/02* (2013.01); *B60L 3/00* (2013.01); *H02H 3/087* (2013.01)

(58) Field of Classification Search
CPC ............ H02H 3/16; H02H 3/087; B60L 3/00; G01R 31/02

USPC ............................................................ 361/87
See application file for complete search history.

(56) References Cited

U.S. PATENT DOCUMENTS

| 5,281,956 A * | 1/1994 | Bashark ........................ 340/660 |
| 2009/0003008 A1* | 1/2009 | Ohtake et al. .................. 362/467 |
| 2009/0040260 A1* | 2/2009 | Anderson et al. ............... 347/19 |

FOREIGN PATENT DOCUMENTS

| JP | 06-308185 | 11/1994 |
| KR | 10-2003-0081690 | 10/2003 |
| KR | 10-2009-0108811 | 10/2009 |
| KR | 10-2011-0048977 | 5/2011 |
| KR | 1020110062276 | 6/2011 |
| KR | 10-2011-0077387 | 7/2011 |

* cited by examiner

*Primary Examiner* — Scott Bauer
(74) *Attorney, Agent, or Firm* — Mintz Levin Cohn Ferris Glovsky and Popeo, P.C.; Peter F. Corless

(57) ABSTRACT

A short-circuit detecting apparatus and method of a heating system for a high voltage battery that includes a plurality of heaters, a short-circuited detection resistor, an A/D converter, and a Battery Management System (BMS). The plurality of heaters are connected to a high voltage battery to heat the high voltage battery. The short-circuit detection resistor is connected between the heaters to detect whether the heaters are short-circuited. The A/D converter is configured to sense a voltage applied across the short-circuit detection resistor. The BMS is configured to calculate a final operation value using the voltage applied across the short-circuit detection resistor and compare the final operation value with the value of battery pack voltage to detect whether the heaters are short-circuited.

5 Claims, 3 Drawing Sheets

SHORT-CIRCUIT DETECTING APPARATUS AND METHOD OF HEATING SYSTEM FOR HIGH VOLTAGE BATTERY

CROSS-REFERENCE TO RELATED APPLICATION

This application claims under 35 U.S.C. §119(a) the benefit of Korean Patent Application No. 10-2012-0139992 filed Dec. 5, 2012, the entire contents of which are incorporated herein by reference.

BACKGROUND (a) Technical Field

The present invention relates to a short-circuit detecting apparatus and method of a heating system for a high voltage battery. More particularly, the present invention relates to an apparatus and method that detects a short-circuit of a heating system that increases the temperature of a high voltage battery used as a main power source in electric vehicles.

(b) Background Art

Generally, a high voltage battery used in electric vehicles and hybrid vehicles shows different output characteristics based on the temperature of the high voltage battery. As the temperature of the high voltage battery decreases, the available output thereof is reduced. When driving a vehicle which has been parked for a substantially long time in cold weather such as a substantially low temperature environment of about −10° C. or less, the available output of the high voltage battery decreases significantly compared to a required output of a vehicle. Accordingly, clattering of a vehicle may give an uncomfortable feeling to a driver, and may acceleration from being capable of occurring.

Particularly, an electric vehicle using only a high voltage battery as a main power source is substantially sensitive to the temperature of the battery as compared to a hybrid vehicle. Accordingly, to prevent the output reduction of the high voltage battery, the output of the high voltage battery must fall within a predetermined range by heating the high voltage battery.

FIG. 1 is an exemplary view illustrating a heating system for a high voltage battery which is currently being applied to an electric vehicle. The heating system 1 includes 8 heaters 2 which are connected in series. The heating system 1 heats the battery by applying a current to the heater 2 including a Positive Temperature Coefficient (PTC) thermistor using the voltage of the high voltage battery. Thus, the heating system operates about 30 minutes earlier than the starting time desired by a user, allowing the high voltage battery to be heated from about −20° C. to −10° C. for 30 minutes.

Since the heating system uses a high voltage, it is important to detect a cut-off, short-circuit, and fusion from a viewpoint of fail safe. As a typical method that detects a short-circuit of a heater, there are various methods such as a current sensor, a temperature sensor, and a voltage sensing of respective heaters. The method that detects the short-circuit of the heater using the temperature sensor includes two temperature sensors attached to a location where the heater in the heating system may be short-circuited, and determines the short-circuit by comparing the temperature of a short-circuited heater with that of a normal heater (e.g., a heat that is not short-circuited).

However, the temperature sensor that detects a cut-off, requires about eight temperature sensors to increase accuracy of the detection, thus increasing a manufacturing cost.

The above information disclosed in this section is only for enhancement of understanding of the background of the invention and therefore it may contain information that does not form the prior art that is already known in this country to a person of ordinary skill in the art.

SUMMARY

The present invention provides an apparatus and method that detects a short-circuit of a heating system for high voltage battery, which may decrease the short-circuit detection time and reduce the manufacturing cost due to a reduction of the number of temperature sensors used, by detecting a short-circuit of the heating system for the high voltage battery used in electric vehicles through a comparison between a pack voltage measured in a Battery Management System (BMS) and a value sensed by a simpler circuit configuration.

In one aspect, the present invention provides a short-circuit detecting apparatus of a heating system for a high voltage battery, the apparatus may include: a plurality of heaters connected to a high voltage battery to heat the high voltage battery; a short-circuit detection resistor connected between the heaters to detect whether the heaters are short-circuited; an analog-to-digital (A/D) converter configured to sense a voltage applied across the short-circuit detection resistor; and a Battery Management System (BMS) configured to calculate a final operation value using the voltage applied across the short-circuit detection resistor and compare the final operation value with the value of battery pack voltage to detect whether the heaters are short-circuited, wherein the apparatus may be configured to reduce a short-circuit detection time and accurately detect whether a short-circuit occurs.

In another aspect, the present invention provides a short-circuit detecting method of a heating system for a high voltage battery, the method may include: sensing a voltage applied across a short-circuit detection resistor connected in series between heaters of the heating system for the high voltage battery using an A/D converter; calculating, by a controller, a final operation value based on Equation (1) below after receiving a signal from the A/D converter; comparing, by the controller, the final operation value with a predetermined battery pack voltage; and determining, by the controller, that a short-circuit does not occur when the final operation value is smaller than the battery pack voltage, and determining, by the controller, that the short-circuit occurs in the heater when the final operation value is equal to or greater than the battery pack voltage, wherein Equation (1) is expressed as $$\frac{\text{short-circuit detection } R}{\text{total resistance} + \text{short-circuit detection } R} \times V_{pack} \times 100 = \quad (1)$$

$$\text{final operation value}$$

In an exemplary embodiment, when the short-circuit occurs, a cell voltage deviation due to battery cell characteristics may be prevented by applying a control algorithm that turns off a heating control relay.

BRIEF DESCRIPTION OF THE DRAWINGS

The above and other features of the present invention will now be described in detail with reference to exemplary embodiments thereof illustrated the accompanying drawings which are given hereinbelow by way of illustration only, and thus are not limitative of the present invention, and wherein.

Figure 1:
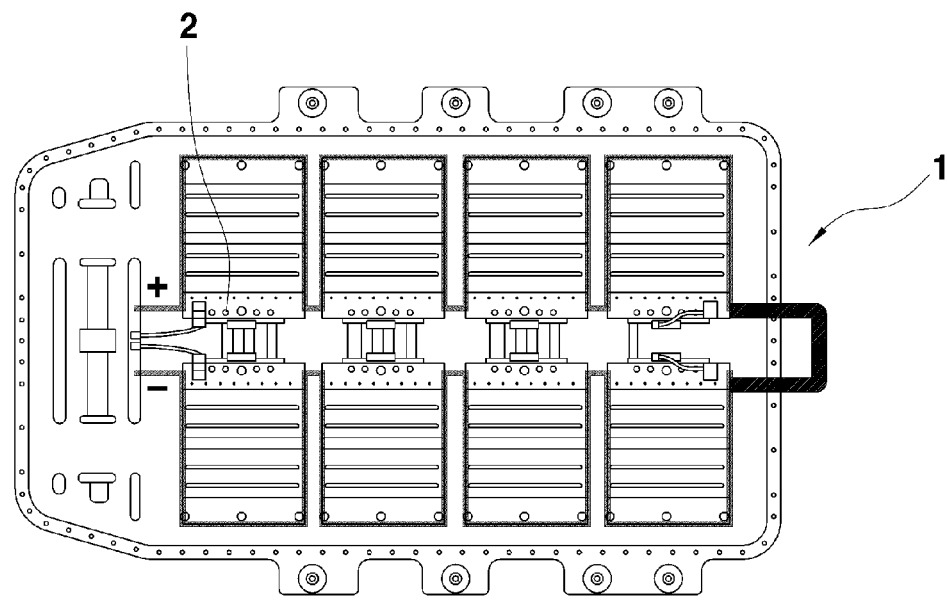
FIG. 1 is an exemplary diagram illustrating a heating system for a high voltage battery applied to electric vehicles according to the related art.

Reference numerals set forth in the Drawings includes reference to the following elements as further discussed below:

| | |
|---|---|
| 10: heating system | 11: heater resistor |
| 12: short-circuit detection resistor | 13: battery pack voltage |
| 14: A/D converter | 15: Battery Management System (BMS) |
| 16: heater | |

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Additionally, it is understood that the term controller refers to a hardware device that includes a memory and a processor. The memory is configured to store the modules and the processor is specifically configured to execute said modules to perform one or more processes which are described further below. Furthermore, control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Hereinafter, exemplary embodiments of the present invention will be described in detail with reference to the accompanying drawings so that those skilled in the art can easily carry out the present invention.

Figure 2:
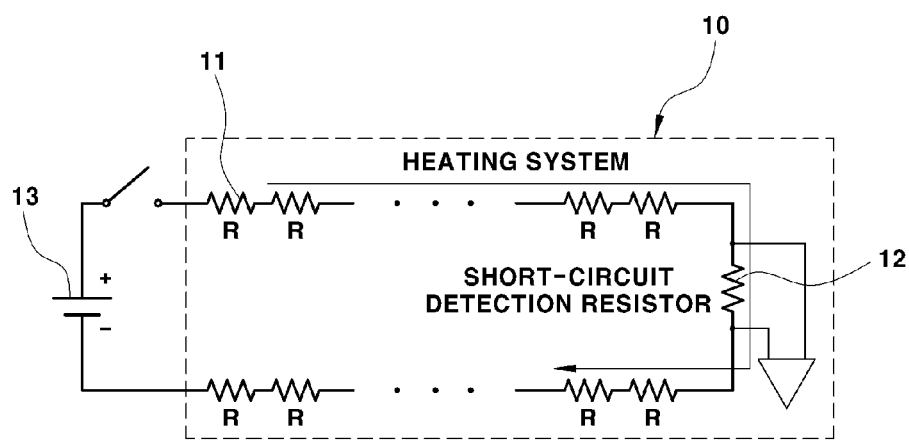
FIG. 2 is an exemplary circuit diagram illustrating a short-circuit detection circuitry of a heating system for a high voltage battery according to an exemplary embodiment of the present invention.
Figure 3:
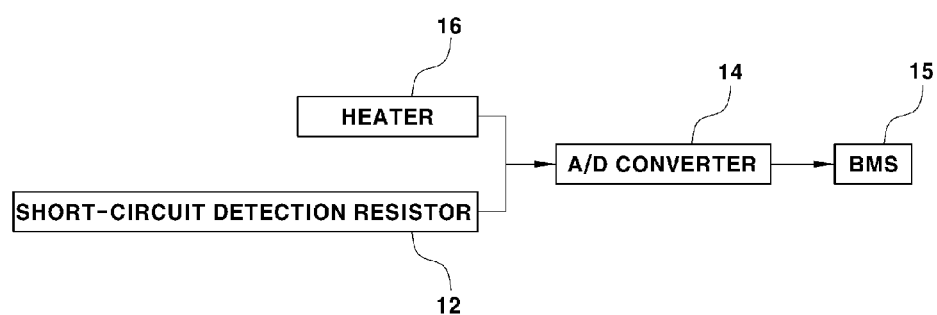
FIG. 3 is an exemplary block diagram illustrating a short-circuit detecting apparatus of a heating system for a high voltage battery according to an exemplary embodiment of the present invention.
Figure 4:
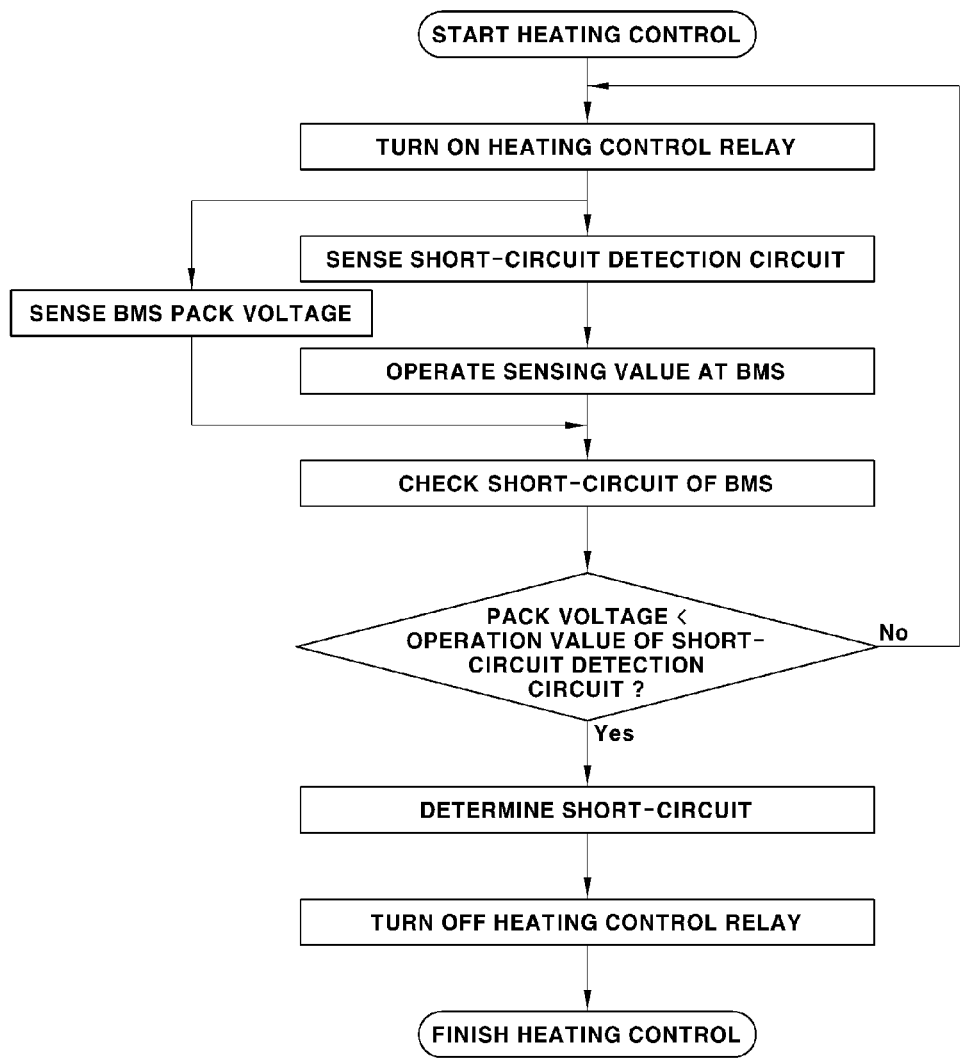
FIG. 4 is an exemplary flowchart illustrating a short-circuit detecting method of a heating system for a high voltage battery according to an exemplary embodiment of the present invention.

FIG. 1 is an exemplary diagram illustrating a heating system for a high voltage battery that is currently being applied to electric vehicles according to the related art. FIG. 2 is an exemplary circuit diagram illustrating a short-circuit detection circuitry of a heating system for a high voltage battery according to an exemplary embodiment of the present invention. FIG. 3 is an exemplary block diagram illustrating a short-circuit detecting apparatus of a heating system for a high voltage battery according to an exemplary embodiment of the present invention. FIG. 4 is an exemplary flowchart illustrating a short-circuit detecting method of a heating system for a high voltage battery according to an exemplary embodiment of the present invention The present invention relates to a short-circuit detecting apparatus and method, which may reduce a detection time and the number of the temperature sensors upon short-circuit detection of a heating system 10 of a high voltage battery pack. The short-circuit detecting apparatus for the heating system 10 of the high voltage battery may be configured to detect a short-circuit by connecting short-circuit detection resistors between heaters 16 connected in series to the high voltage battery. The high voltage battery may be used as a main power source for driving a vehicle in electric vehicles and hybrid vehicles A short-circuit detecting apparatus for a heating system according to an embodiment of the present invention may include a high voltage battery used as a main power source in electric vehicles, a plurality of heaters 16 connected in series to the high voltage battery, and a short-circuit detection resistor 12 additionally connected in series in the substantially middle of the heaters 16.

Additionally, the short-circuit detecting apparatus may include an A/D converter 14 and a Battery Management System (BMS) 15. The A/D converter 14 may be configured to sense a voltage applied across a short-circuit detection resistor 12. The BMS 15 may be configured to detect whether the heater 16 is short-circuited by calculating a final operation value using the voltage applied across the short-circuit detection resistor 12 and comparing the final operation value with the value of a battery pack voltage source 13. In particular, a current flowing within the heater 16 constituting the heating system 10 may flow within the short-circuit detection resistor 12 connected in series to the heater 16. Thus, it may be possible to detect a voltage applied across a specific short-circuit detection resistor 12.

The following equation (1) shows that the final operation value may be obtained by multiplying an equation calculating a short-circuit detection resistance by 100. Thus, the presence or absence of the short-circuit may be detected by Equation (1) below.

$$\frac{\text{short-circuit detection } R}{\text{total resistance} + \text{short-circuit detection } R} \times Vpack \times 100 = \text{final operation value} \quad (1)$$

Here, Vpack is the battery pack voltage source 13, and short-circuit R is the short-circuit detection resistor 12. However, the ratio of total resistance to short-circuit detection R may be 100 to 1.

The voltage applied across the short-circuit detection resistor 12 may be sensed using the A/D converter 14, and may be operated by a central processing unit (CPU, e.g., a controller) of the BMS 15 according to the above equation. Further, the presence or absence of the short-circuit may be determined by comparing the calculated final operation value with the value of the Vpack sensed by BMS 15.

When the final operation value is lower than the value of the battery pack voltage source 13, the absence of a short-circuit may be determined in the heater 16 of the heating system 10. Since the short-circuit detection resistor 12 and the heater resistors 11 are connected in series to the battery pack, the sum of voltages applied across the short-circuit detection resistor 12 and heater resistors 11, respectively, may be equal to the value of the battery pack voltage source 13. Accordingly, when a short-circuit is absent the final operation value that is the voltage applied across the short-circuit detection resistor 12 may be smaller than the value of the battery pack voltage source 13. Additionally, when the final operation value is larger than the value of the battery pack voltage source 13, a short-circuit may occur in one or more heaters 16 of the heating system 10.

The short-circuit of the heater 16 means a reduction of the total heater resistance and shows an increase of the voltage applied across the short-circuit detection resistor 12. Accordingly, when a short-circuit occurs in one or more heaters 16, the final operation value may be equal to or greater than the value of the battery pack voltage source 13.

According to the method, when a short-circuit occurs in one or more heaters 16, the control algorithm is applied to turn off a relay in a direction where the heating system 10 does not operate. Thus, a cell voltage deviation due to the battery cell characteristics may be prevented, and the deterioration of the battery may be prevented from a long-term point of view.

According to an exemplary embodiment of the present invention, whether the heaters 16 of the heating system 10 of the high voltage battery are short-circuited may be determined, by in series connecting the short-circuit detection resistor 12 among heaters 16 connected in series to the high voltage battery and comparing the voltage applied across the short-circuit detection resistor 12 with the value of the battery pack voltage source 13. Thus, the short-circuit detection time may be substantially reduced, and the number of temperature sensors attached to the heaters 16 may be reduced, compared to a typical short-circuit detecting method using a typical temperature sensor.

The invention has been described in detail with reference to exemplary embodiments thereof. However, it will be appreciated by those skilled in the art that changes may be made in these embodiments without departing from the principles and spirit of the invention, the scope of which is defined in the accompanying claims and their equivalents.

What is claimed is:

1. A short-circuit detecting apparatus of a heating system for a high voltage battery, the apparatus comprising:
   a plurality of heaters connected to a high voltage battery and configured to heat the high voltage battery;
   a short-circuit detection resistor connected between the heaters and configured to detect whether the heaters are short-circuited;
   an analog-to-digital (A/D) converter configured to sense a voltage applied across the short-circuit detection resistor; and
   a Battery Management System (BMS) configured to calculate a final operation value using the voltage applied across the short-circuit detection resistor and compare the final operation value with the value of battery pack voltage to detect whether the heaters are short-circuited.

2. A short-circuit detecting method of a heating system for a high voltage battery, the method comprising:
   sensing, by an analog-to-digital (A/D) converter, a voltage applied across a short-circuit detection resistor connected in series between heaters of the heating system for the high voltage battery;
   calculating, by a controller, a final operation value according to Equation (1) below after receiving a signal from the A/D converter;
   comparing, by the controller, the final operation value with a predetermined battery pack voltage;
   determining, by the controller, an absence of a short-circuit when the final operation value is smaller than the battery pack voltage; and
   determining, by the controller, that the short-circuit occurs in the heater when the final operation value is equal to or greater than the battery pack voltage,
   wherein Equation (1) is expressed as $$\frac{\text{short-circuit detection } R}{\text{total resistance} + \text{short-circuitdetection } R} \times Vpack \times 100 = \text{final operation value} \quad (1)$$

wherein, Vpack is the battery pack voltage source, and short-circuit R is the short-circuit detection resistor.

3. The method of claim 2, wherein when the short-circuit occurs, a cell voltage deviation due to battery cell characteristics is prevented by applying a control algorithm that turns off a heating control relay.

4. A non-transitory computer readable medium containing program instructions executed by a processor or controller, the computer readable medium comprising:
   program instructions that control an analog-to-digital (A/D) converter to sense a voltage applied across a short-circuit detection resistor connected in series between heaters of the heating system for the high voltage battery;

program instructions that calculate a final operation value according to Equation (1) below after receiving a signal from the A/D converter;

program instructions that compare the final operation value with a predetermined battery pack voltage;

program instructions that determine an absence of a short-circuit when the final operation value is smaller than the battery pack voltage; and program instructions that determine that the short-circuit occurs in the heater when the final operation value is equal to or greater than the battery pack voltage, wherein Equation (1) is expressed as $$\frac{\text{short-circuit detection } R}{\text{total resistance} + \text{short-circuit detection } R} \times Vpack \times 100 = \text{final operation value} \qquad (1)$$

wherein, Vpack is the battery pack voltage source, and short-circuit R is the short-circuit detection resistor.

5. The non-transitory computer readable medium of claim 4, further comprising:

program instructions that apply a control algorithm that turns off a heating control relay when the short-circuit occurs to prevent a cell voltage deviation due to battery cell characteristics.

* * * * *